(12) United States Patent
Parkhurst et al.

(10) Patent No.: US 8,896,323 B2
(45) Date of Patent: Nov. 25, 2014

(54) RADIATION-TOLERANT OVERCURRENT DETECTION

(75) Inventors: Charles Parkhurst, Murphy, TX (US); Mark Hamlyn, Melissa, TX (US)

(73) Assignee: Texas Instruments Incorporated, Dallas, TX (US)

(*) Notice: Subject to any disclaimer, the term of this patent is extended or adjusted under 35 U.S.C. 154(b) by 489 days.

(21) Appl. No.: 13/279,049

(22) Filed: Oct. 21, 2011

(65) Prior Publication Data

US 2013/0099796 A1 Apr. 25, 2013

(51) Int. Cl.
*G01R 31/02* (2006.01)
*H03K 19/003* (2006.01)
*G01R 19/165* (2006.01)
*G01R 31/26* (2014.01)

(52) U.S. Cl.
CPC .... *G01R 19/16571* (2013.01); *H03K 19/00338* (2013.01)
USPC ...... 324/555; 324/76.39; 324/713; 361/931.1

(58) Field of Classification Search
CPC ........... G01R 19/19145; G01R 31/085; G01R 31/2607; G01R 31/021; G01R 31/026
USPC .......................... 324/500–555, 76.11–76.76; 361/93.1–93.3
See application file for complete search history.

(56) References Cited

U.S. PATENT DOCUMENTS

| | | | |
|---|---|---|---|
| 5,047,620 A * | 9/1991 | Durvasula et al. | 250/208.2 |
| 7,203,046 B2 * | 4/2007 | Ohshima | 361/93.1 |
| 2009/0160428 A1 * | 6/2009 | Tai | 324/76.11 |
| 2009/0179621 A1 * | 7/2009 | Kimura | 323/265 |
| 2013/0043903 A1 * | 2/2013 | Parkhurst et al. | 326/80 |

* cited by examiner

*Primary Examiner* — Melissa Koval
*Assistant Examiner* — Emily Chan
(74) *Attorney, Agent, or Firm* — Alan A. R. Cooper; Frederick J. Telecky, Jr.

(57) ABSTRACT

Systems and methods for radiation-tolerant overcurrent detection are disclosed. In some embodiments, an integrated circuit may include a plurality of overcurrent detectors, each of the plurality of overcurrent detectors configured to detect a candidate overcurrent event. The integrated circuit may also include a voting circuit coupled to the overcurrent detectors, the voting circuit configured to indicate an overcurrent in response to receiving a selected number of candidate overcurrent events from the overcurrent detectors. At least one of the overcurrent detectors may be subject to detecting the candidate overcurrent in error, at least in part, due to exposure to ionizing radiation.

12 Claims, 4 Drawing Sheets

RADIATION-TOLERANT OVERCURRENT DETECTION

TECHNICAL FIELD

This specification is generally directed to electronic circuits, and, more specifically, to radiation-tolerant overcurrent detection.

BACKGROUND

The outer space has proven to be a harsh environment for electronic circuits. When satellites, space shuttles, space probes, etc. leave the Earth's atmosphere, the electronic equipment they carry becomes subject to levels of ionizing radiation that are much higher than those found near the Earth's surface. These high radiation levels are known to alter logic states of components within integrated circuits, which may in turn lead to performance degradation and even catastrophic failure. Ionizing radiation also presents problems in other environments, such as, for example, nuclear facilities (e.g., due to the presence of radioactive materials), X-ray rooms, particle accelerators, and the like.

Generally speaking, ionizing radiation includes particles and/or electromagnetic waves that contain enough energy to cause electrons to detach from atoms or molecules, thus "ionizing" them. Examples of ionizing particles include alpha particles, beta particles, neutrons, cosmic rays, etc. These types of particles typically have much higher energy than other, lower-level types of radiation, such as visible light, infrared light, radio waves, etc.

In some cases, shielded packaging may be used to protect an integrated circuit from radiation exposure. The effectiveness of a shielded package may vary widely depending upon its particular design, materials, etc. As a rule of thumb, however, better shielding is achieved with heavier, bulkier packaging. In other cases, the physical size of devices (e.g., transistors, etc.) fabricated within the integrated circuit may be increased in an attempt to reduce their sensitivity to radiation. Typically, the larger the size of a device, the better its immunity or tolerance to radiation. Large device sizes, however, also increase capacitance and therefore cause a decrease in the speed at which an integrated circuit can operate.

SUMMARY OF THE INVENTION

Systems and methods for radiation-tolerant overcurrent detection are disclosed. In some embodiments, an apparatus may include a power source and a plurality of comparators, where each of the plurality of comparators is coupled to one of: a high-side or a low-side field-effect transistor (FET) of direct current (DC)-to-DC converter. Each of the plurality of comparators may also be configured to compare an output voltage with a preset overcurrent threshold voltage, and to determine whether an overcurrent event has occurred based, at least in part, upon the comparison. The apparatus may further include a logic circuit coupled to each of the plurality of comparators. The logic circuit may be configured to indicate the presence of an overcurrent in response to a selected number of the plurality of comparators determining that the overcurrent event has occurred, and to indicate the absence of the overcurrent in response to fewer than the selected number of the plurality of comparators determining that the overcurrent event has occurred.

In some cases, the plurality of comparators may include three comparators such that a selected number of comparators includes two (or all three) of the comparators, hence fewer than the selected number of comparators includes one (or none) of the comparators. Also, at least one of the comparators may be physically arranged in a non-linear manner (e.g., not in a straight line) with respect to at least two other comparators. When its design allows for two or more planes (e.g., a three-dimensional layout), at least one of the comparators may be placed in a different plane than other comparators. In this manner, a single radiation event may be less likely to affect all comparators at once.

In an embodiment, the logic circuit may operate in "majority voting" mode and may include, for example, three AND gates and an OR gate coupled to the outputs of the three AND gates. In that case, an output of a first comparator may be coupled to a first input of a first AND gate and to a first input of a second AND gate, an output of a second comparator may be coupled to a second input of the first AND gate and to a first input of a third AND gate, and an output of a third comparator may be coupled to a second input of the second AND gate and a second input of the third AND gate.

In another embodiment, the logic circuit may operate in "unanimous voting" mode and may include, for example, two AND gates. In that case, the output of the first comparator may be coupled to a first input of the first AND gate, the output of the second comparator may be coupled to the second input of the first AND gate, the output of the first AND gate may be coupled to the first input of the second AND gate, and the output of the third comparator may be coupled to the second input of the second AND gate. In some situations, operation in the "unanimous voting" mode may reduce sensitivity to ionizing radiation.

In certain embodiments, the logic circuit may include a programmable circuit. For example, the programmable circuit may be configured to assign a first weight to a first overcurrent determination made by a first comparator, a second weight to a second overcurrent determination made by a second comparator, and/or a third weight to a third overcurrent determination made by a third comparator. Each weight may be different from each other and/or may be a function of the physical placement of the comparators and their respective sensitivities to radiation events. Moreover, the programmable circuit may be selectably set to operate in a majority voting mode or a unanimous voting mode with respect to overcurrent determinations made by the comparators.

In some embodiments, an integrated circuit may include a plurality of overcurrent detectors, each of the plurality of overcurrent detectors configured to detect a candidate overcurrent event. The integrated circuit may also include a voting circuit coupled to the overcurrent detectors, the voting circuit configured to indicate an overcurrent in response to receiving a selected number of candidate overcurrent events from the overcurrent detectors. Furthermore, at least one of the candidate overcurrents may have been detected in error due, at least in part, to ionizing radiation exposure.

In other embodiments, a method may include receiving a first indication of a first overcurrent event from a first of a plurality of overcurrent detectors coupled to a power source, where the first overcurrent detector is subject to ionizing radiation exposure. The method may also include indicating the presence of an overcurrent in response to receiving a second indication of a second overcurrent event from a second overcurrent detector coupled to the power source. Conversely, in response to not receiving the second indication of the second overcurrent event from the second of the overcurrent detectors, the method may include indicating the absence of the overcurrent. In some cases, the method may include indicating the presence of the overcurrent in response to the second indication from the second of the overcurrent detectors in addition to a third indication of a third overcurrent event from a third of the overcurrent detectors.

BRIEF DESCRIPTION OF THE DRAWINGS

Figure 1:
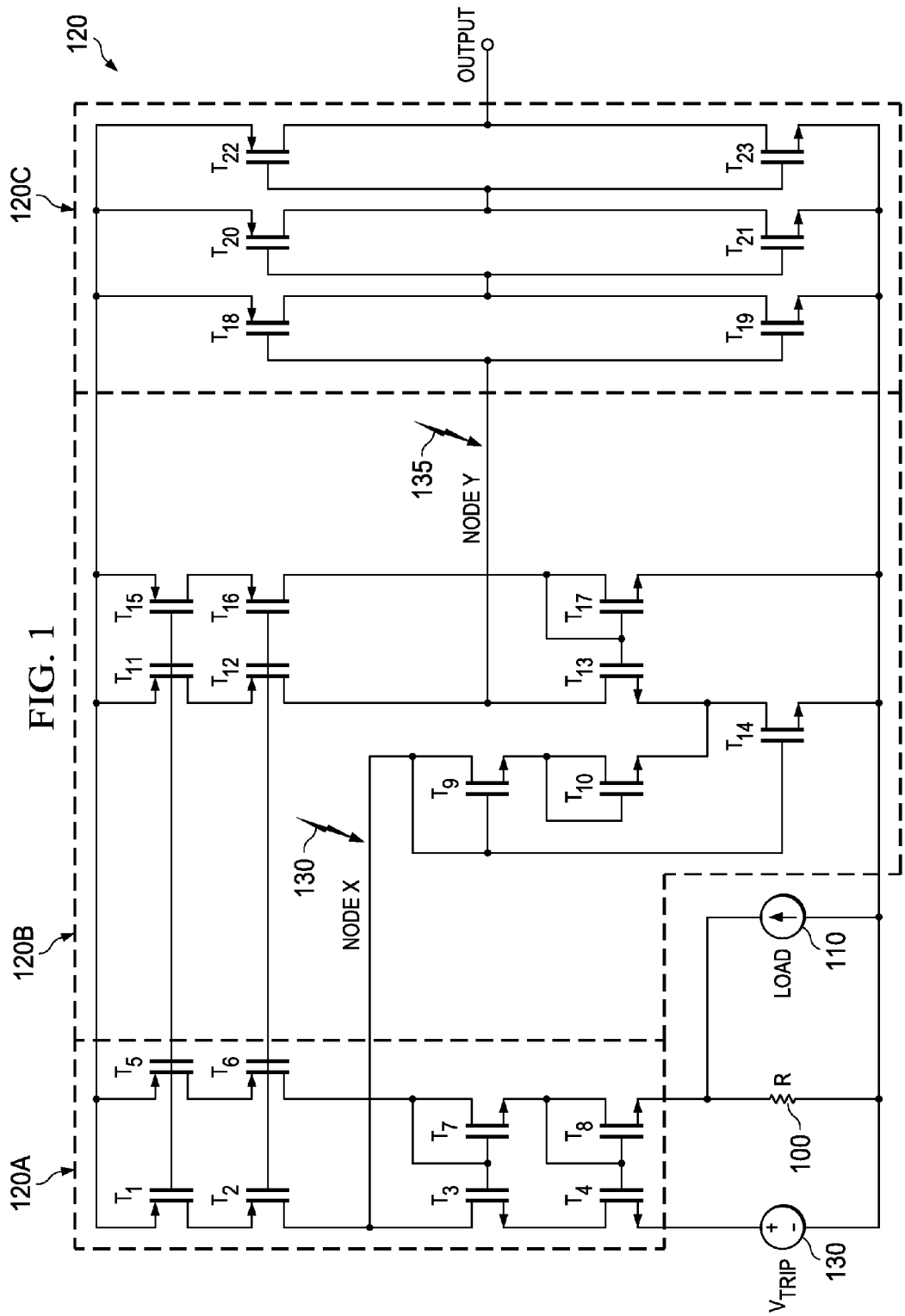

Having thus described the invention in general terms, reference will now be made to the accompanying drawings, wherein:

FIG. 1 is a circuit diagram of an overcurrent detector subject to ionizing radiation according to some embodiments.

Figure 2:
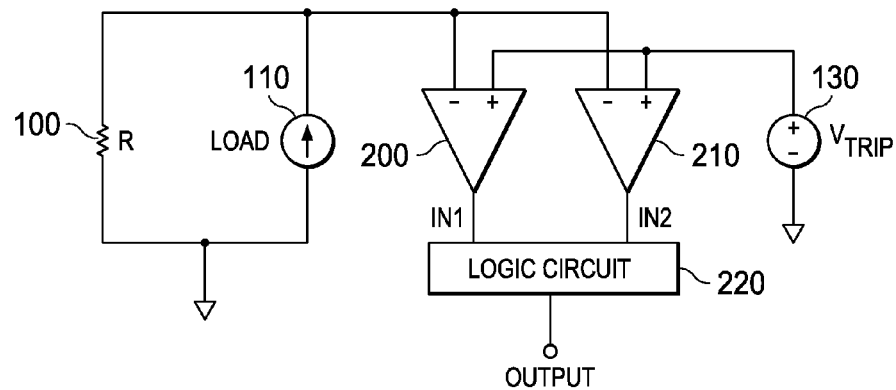

FIG. 2 is a block diagram of a dual overcurrent detector circuit according to some embodiments.

Figure 3:
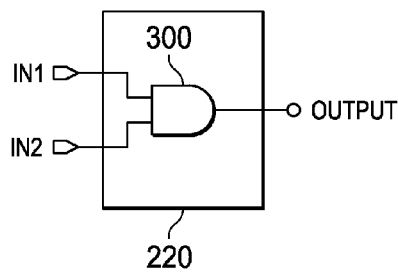

FIG. 3 is a block diagram of a logic circuit according to some embodiments.

Figure 4:
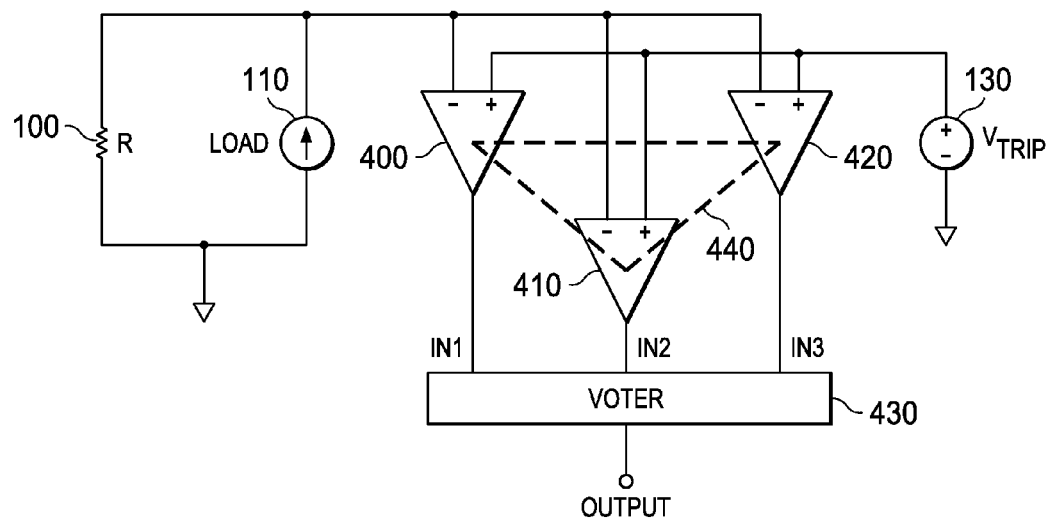

FIG. 4 is a block diagram of a triple overcurrent detector circuit according to some embodiments.

Figure 5:
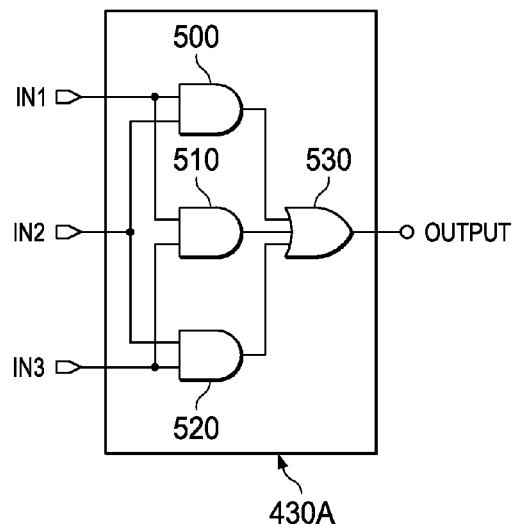

FIG. 5 is a block diagram of a voter circuit configured to operate in majority voting mode according to some embodiments.

Figure 6:
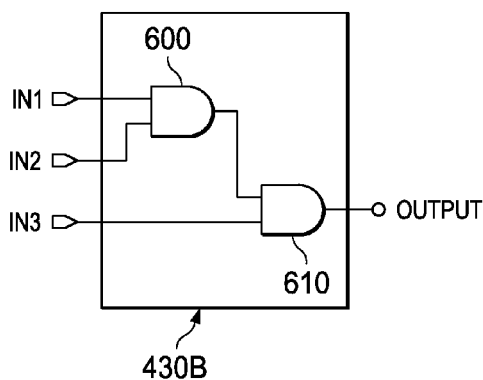

FIG. 6 is a block diagram of a voter circuit configured to operate in unanimous voting mode according to some embodiments.

Figure 7:
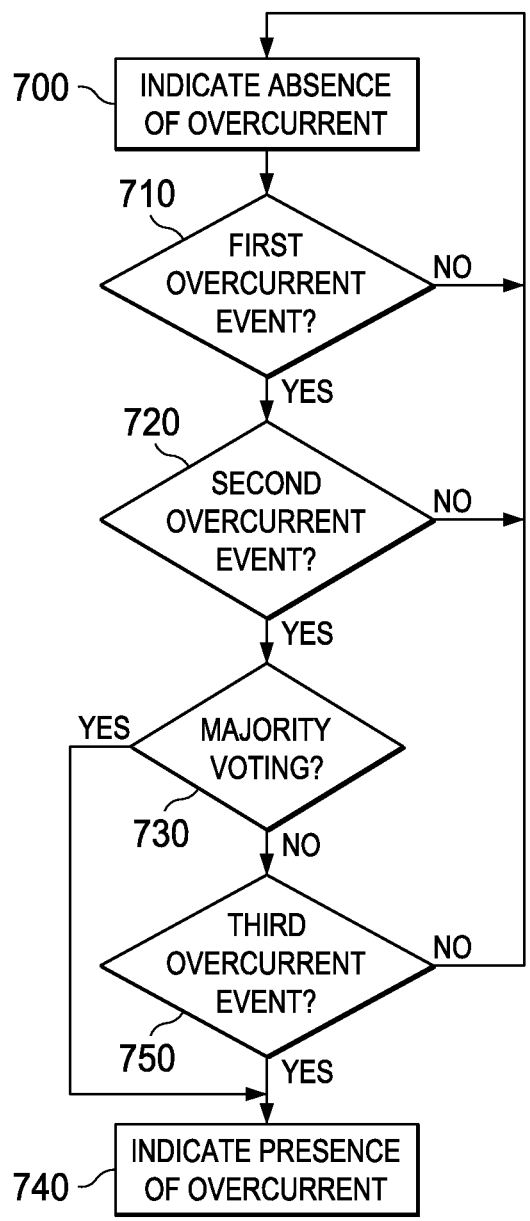

FIG. 7 is a flowchart of a method for performing radiation-tolerant overcurrent detection according to some embodiments.

Figure 8:
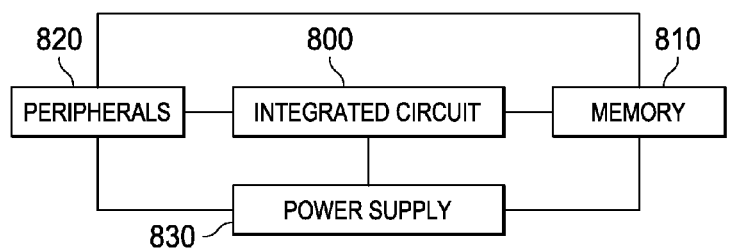

FIG. 8 is a block diagram of system or apparatus according to some embodiments.

DETAILED DESCRIPTION

The invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to a person of ordinary skill in the art. A person of ordinary skill in the art will be able to use the various embodiments of the invention.

FIG. 1 is a circuit diagram of overcurrent detector or comparator 120 coupled to resistor 100 and subject to ionizing radiation according to some embodiments. As illustrated, resistor 100 is coupled to load 110. In some implementations, resistor 100 may be used to model a drain-to-source resistance across a field-effect transistor (FET), metal-oxide field-effect transistor (MOSFET), etc. at an output of a direct current (DC)-to-DC converter (e.g., high-side or low-side FET). Examples of such implementations are illustrated in FIGS. 2 and 4 discussed in more detail below.

In various embodiments, such a DC-to-DC converter may include any point-of-load DC-to-DC device, such as, for instance, plug-in power modules, DC/DC controllers (with external or integrated field-effect transistors (FETs)), inductorless DC/DC regulators, charge pumps, or the like. More generally, however, such a DC-to-DC converter may be replaced by any power source, amplifier, and/or regulator that may potentially be subject to overcurrent errors. Accordingly, load 110 may include any circuitry such as for example, logic circuits, programmable circuits, memory circuits, processors, etc.

Overcurrent detector 120 is coupled to resistor 100 and to preset overcurrent threshold voltage 130 ($V_{TRIP}$). As shown, overcurrent detector 120 includes first stage 120A, second stage 120B, and output stage 120C. In operation, NODE X (between first and second stages 120A-B) and NODE Y (between second and output stages 120B-C) indicate whether an overcurrent situation is present across resistor 100 (e.g., an FET, etc.). Specifically, when the voltage across resistor 100 is greater than $V_{TRIP}$ 130, NODE X (and NODE Y) is pulled down thus indicating the presence of an overcurrent at OUTPUT. Conversely, when the voltage across resistor 100 is smaller than $V_{TRIP}$ 130, NODE X (and also NODE Y) is pulled up, thus indicating the absence of the overcurrent at OUTPUT. In some cases, in response to the occurrence of an overcurrent, the circuit may be shut down, a current limiter may be applied, etc. to avoid performance degradation, catastrophic failure, etc.

Generally speaking, certain features or devices within overcurrent detector 120, including p-type transistors ($T_1$, $T_2$, $T_5$, $T_6$, $T_{11}$, $T_{12}$, $T_{15}$, $T_{16}$, $T_{18}$, $T_{20}$, and $T_{22}$), n-type transistors ($T_3$, $T_4$, $T_7$-$T_{10}$, $T_{13}$, $T_{14}$, $T_{17}$, $T_{19}$, $T_{21}$, and $T_{23}$), as well as connections between these various transistors, may be subject to ionizing radiation in some applications. Moreover, it has been discovered that NODES X and Y are particularly sensitive to single event upsets 130 and 135, respectively, due at least in part to their low capacitance nature, which in turn is dictated by fast overcurrent detection requirements. Accordingly, when either of the diffusions on the common drain connections or NODES X and Y are subject to heavy ions induced by radiation, OUTPUT may inadvertently signal an overcurrent detection.

In alternative embodiments, overcurrent detector 120 may have different internal features and/or devices than those depicted in FIG. 1. For example, in some cases overcurrent detector 120 may be a single stage detector. Thus, generally speaking, overcurrent detector 120 may be any comparator circuit configured to determine whether an overcurrent has developed across resistor 100 (or some other power source, amplifier, regulator, etc.).

Turning now to FIG. 2, a block diagram of a dual overcurrent detector circuit is depicted according to some embodiments. As shown, two overcurrent detectors 200 and 210 are each connected across resistor 100. As such, each of overcurrent detectors 200 and 210 may be configured to independently detect an overcurrent situation at resistor 100. Specifically, overcurrent detector 200 may have a first input coupled to resistor 100 and a second input coupled to $V_{TRIP}$ 130. Similarly, overcurrent detector 210 may have a first input coupled to resistor 100 and a second input coupled to $V_{TRIP}$ 130. Therefore, each of overcurrent detectors 200 and 210 may be capable of separately comparing the voltage across resistor 100 to $V_{TRIP}$ 130, and independently determining whether an overcurrent event has occurred.

Logic circuit 220 is coupled to the outputs of overcurrent detectors 200 and 210, and may be configured to determine, based on the separate comparisons performed by overcurrent detectors 200 and 210, whether the overcurrent situation exists. For example, assume a scenario where a stray charge or a heavy ion reaches NODE X (or other feature/device) within overcurrent detector 200. In that case, overcurrent detector 200 may indicate an overcurrent event, but that indication may be in error—i.e., not due to an actual overcurrent at across resistor 100, but instead due only to the stray charge or ion. If the same ion does not affect overcurrent detector 210, however, overcurrent detector 210 may not indicate the same overcurrent event. Accordingly, in some embodiments, logic circuit 220 may be configured to indicate the existence of an actual overcurrent situation only if both overcurrent detectors 200 and 210 also indicate the occurrence of an overcurrent event. This embodiment is illustrated in FIG. 3, where logic circuit 220 includes AND gate 300 coupled to the outputs of each of overcurrent detectors 200 and 210.

In the embodiment shown in FIG. 2, it is possible for a single event upset to affect both overcurrent detectors 200 and 210. For instance, if an ion travels in a straight line, as is often the case, then the same ion could hit both overcurrent detector 200 and overcurrent detector 210. In part to address this concern, FIG. 4 shows a block diagram of a triple overcurrent detector circuit according to some embodiments. As shown, three overcurrent detectors or comparators 400-420 are coupled to resistor 100 and $V_{TRIP}$ 130 in a manner similar to that described with respect to FIG. 3. Furthermore, each of overcurrent detectors 400-420 is coupled to voter circuit 430, described in more detail below in FIGS. 5 and 6. As with logic circuit 320, here voter circuit 430 may determine, based on the various possible outputs of overcurrent detectors 400-420, whether an overcurrent situation exists.

In some embodiments, at least one of overcurrent detectors 400-420 may be physically arranged in a non-linear manner with respect to the others. For example, overcurrent detectors 400-420 may be arranged or laid out at the vertices of triangle 440 so as to avoid having all three overcurrent detectors 400-420 along a single straight line (and therefore potentially subject to the same event upset). Additionally or alternatively, one or more of overcurrent detectors 400-420 may be arranged in a different plane of an integrated circuit (e.g., on different layers of silicon in a three-dimensional design) for similar reasons.

In certain embodiments, voter circuit 430 may operate in majority voting mode or unanimous voting mode. FIG. 5 is a block diagram of voter circuit 430 configured to operate in majority voting mode according to some embodiments. In particular, voter circuit 430A includes first AND gate 500, second AND gate 510, third AND gate 520, and OR gate 530. OR gate 530 is coupled to the outputs of first, second, and third AND gates 500-520. Moreover, the output of first overcurrent detector 400 is coupled to a first input of first AND gate 500 and to a first input of second AND gate 510. The output of second overcurrent detector 410 is coupled to a second input of first AND gate 500 and to a first input of third AND gate 520. And the output of third overcurrent detector 420 is coupled to a second input of second AND gate 510 and a second input of third AND gate 520.

In operation, voter circuit 430A may report an overcurrent error if at least two of overcurrent detectors 400-420 also indicates an overcurrent—i.e., a majority of the detectors. If, on the other hand, less than a majority of the detectors indicates the overcurrent—i.e., one or none of overcurrent detectors 400-420—then voter circuit 430A may not report the overcurrent error.

In contrast with voter circuit 430A, voter circuit 430B of FIG. 6 is configured to operate in unanimous voting mode according to some embodiments. Here, voter circuit 430B includes first AND gate 600 and second AND gate 610. As illustrated, the output of first overcurrent detector 400 is coupled to a first input of first AND gate 600 and the output of second overcurrent detector 410 is coupled to a second input of first AND gate 600. Further, the output of first AND gate 600 is coupled to a first input of second AND gate 610 and the output of third overcurrent detector 420 is coupled to a second input of second AND gate 610. In this manner, voter circuit 430 may report an overcurrent error only if all three overcurrent detectors 400-420 indicate a respective overcurrent event. The probability of all three detectors having an ion strike is considered low, especially when the detectors are physically spaced within the integrated circuit.

The embodiments shown in FIGS. 5 and 6 are for illustrative purposes only. It should be understood that certain variations may be implemented to achieve similar results. As an example, OR gate 530 may be replaced with a NOR gate in FIG. 5 to provide the same "majority voting" operation(s). As another example, AND gates 600 and 610 may be replaced by a single, three-input AND gate in FIG. 6 to provide the same "unanimous voting" operation(s).

In some cases, voting circuit 430 may be implemented as a programmable circuit or logic device such as, for example, a programmable logic array, a field-programmable gate array (FPGA), or the like. As such, voting circuit 430 may be configured to operate in a majority voting mode (e.g., as voting circuit 430A of FIG. 5) and/or in a unanimous voting mode (e.g., as voting circuit 430B of FIG. 6) as selected by a user. In cases where a particular overcurrent detector is deemed to be extra sensitive to radiation at least in part due to the integrated circuit's layout (i.e., due to its physical location within the integrated circuit, etc.), voting circuit 430 may be configured to assign a different weight to that detector's determination of an overcurrent event. More generally, voting circuit 430 may assign a different weight to each of a plurality of overcurrent detectors in order to determine whether to report an overcurrent error.

FIG. 7 is a flowchart of a method for performing radiation-tolerant overcurrent detection according to some embodiments. This particular method is illustrated with reference to the system described in FIG. 4 using three overcurrent detectors, although the same method may be readily modified to accommodate other systems with any number of detectors. At block 700, the method may indicate the absence of an overcurrent error, for example, as its default or initial state. At block 710, the method may determine whether a first overcurrent detector has detected an overcurrent event. The overcurrent event may be deemed a "candidate" event insofar as, at this point, it has not been determined whether the event is due to an actual overcurrent detection at the output of a power source or due to an error resulting from ionizing radiation, etc. If the first overcurrent detector has detected the candidate overcurrent event, control passes to block 720; otherwise, control returns to block 700. At block 720, the method may determine whether a second overcurrent detector has also detected another candidate overcurrent event. If so, control passes to block 730; otherwise, control returns to block 700.

At block 730, the method may determine whether a majority voting mode has been selected. If so, then at block 740 the method may indicate the presence of an overcurrent or otherwise report an error (i.e., two out of three detectors have reported the overcurrent event). Otherwise, it may be implied that the current mode of operation is unanimous voting, and block 750 may determine whether the third overcurrent detector has detected yet another candidate overcurrent event. If so, block 740 may report the error (i.e., three out of three detectors have reported the overcurrent event). Otherwise, control returns to block 700.

In some cases, the operations shown in FIG. 7 may be performed by voting circuit 430. It will be understood that blocks 700-740 of the process illustrated in FIG. 7 may be executed simultaneously and/or sequentially. It will be further understood that each operation may be performed in any order and may be performed once or repetitiously.

Turning now to FIG. 8, a system or apparatus incorporating at least one instance of integrated circuit 800 is depicted according to some embodiments. In some cases, integrated circuit 800 may be a system-on-chip (SoC), application specific integrated circuit (ASIC), microprocessor, etc. As illustrated, integrated circuit 800 is coupled to one or more peripherals 820 and external memory 810. Power supply 830 is also provided which supplies the supply voltages to integrated circuit 800 as well as one or more supply voltages to memory 810 and/or peripherals 820.

Power supply 830 may include any battery or other electric energy source, and may provide electrical energy to integrated circuit 800, memory 810, and/or peripherals 820. In some embodiments, integrated circuit 800 may use power supply 830 to feed an internal DC-to-DC converter, power source, amplifier, and/or regulator, which in turn may be monitored by a plurality of overcurrent detectors or comparators in combination with one or more logic or voting circuits as described with respect to FIGS. 1-6. Additionally or alternatively, integrated circuit 800 may include overcurrent detection circuitry configured to identify overcurrent situations with respect to power supply 830 itself. In other embodiments, the overcurrent detection circuits shown in FIGS. 1-6 may also be used to monitor and/or report overcurrents in connection with DC-to-DC converters, power sources, amplifiers, and/or regulators that are internal to memory 810 and/or peripherals 820. Moreover, in some embodiments, more than one instance of integrated circuit 800, memory 810, and/or peripherals 820 may be included in a same system or apparatus.

Peripherals 820 may include any desired circuitry, depending on the type of system. In certain types of space applications, for instance, the system of FIG. 8 may be a satellite system (e.g., part of a global-positioning satellite or GPS) or the like, and peripherals 820 may include devices for various types of satellite communications, such as, for example, radio communications or the like. Generally speaking, however, the system of FIG. 8 may be implemented in any type of computing or electronic system such as, for example, desktop and laptop computers, tablets, network appliances, mobile phones, personal digital assistants, e-book readers, televisions, game consoles, etc. Accordingly, peripherals 820 may include any type of device including, for example, interface devices such as a display screen, including touch display screens or multi-touch display screens, keyboard or other input devices, microphones, speakers, etc., devices for various types of communication, such as Wi-Fi™, Bluetooth®, cellular, etc.

External memory 810 may include any type of memory. For example, external memory 810 may include SRAM, non-volatile RAM (NVRAM, such as "flash" memory), and/or dynamic RAM (DRAM) such as synchronous DRAM (SDRAM), double data rate (DDR, DDR2, DDR3, etc.) SDRAM, etc. External memory 810 may include one or more memory modules to which the memory devices are mounted, such as single inline memory modules (SIMMs), dual inline memory modules (DIMMs), etc.

Many of the operations described herein may be implemented in hardware, software, and/or firmware, and/or any combination thereof. When implemented in software, code segments perform the necessary tasks or operations. The program or code segments may be stored in a processor-readable, computer-readable, or machine-readable medium. The processor-readable, computer-readable, or machine-readable medium may include any device or medium that can store or transfer information. Examples of such a processor-readable medium include an electronic circuit, a semiconductor memory device, a flash memory, a ROM, an erasable ROM (EROM), a floppy diskette, a compact disk, an optical disk, a hard disk, a fiber optic medium, etc.

The software code segments may be stored in any volatile or non-volatile storage device, such as a hard drive, flash memory, solid state memory, optical disk, CD, DVD, computer program product, or other memory device, that provides computer-readable or machine-readable storage for a processor or a middleware container service. In other embodiments, the memory may be a virtualization of several physical storage devices, wherein the physical storage devices are of the same or different kinds. The code segments may be downloaded or transferred from storage to a processor or container via an internal bus, another computer network, such as the Internet or an intranet, or via other wired or wireless networks.

Many modifications and other embodiments of the invention will come to mind to a person of ordinary skill in the art to which this invention pertains having the benefit of the teachings presented in the foregoing descriptions, and the associated drawings. Therefore, it is to be understood that the invention is not to be limited to the specific embodiments disclosed. Although specific terms are employed herein, they are used in a generic and descriptive sense only and not for purposes of limitation.

What is claimed is:

1. An apparatus comprising:
   an electrical power source;
   a plurality of comparators, each of the plurality of comparators coupled to one of: a high-side or a low-side field-effect transistor (FET) of direct current (DC)-to-DC converter, each of the plurality of comparators configured to compare an output voltage with a preset overcurrent threshold voltage, wherein the output voltage is the voltage outputted from the direct current (DC)-to (DC) converter, and each of the plurality of comparators further configured to determine whether an overcurrent event has occurred based, at least in part, upon the comparison; and
   a logic circuit coupled to each of the plurality of comparators, the logic circuit configured to indicate the presence of an overcurrent in response to a selected number of the plurality of comparators determining that the overcurrent event has occurred, and the logic circuit further configured to indicate the absence of the overcurrent in response to fewer than the selected number of the plurality of comparators determining that the overcurrent event has occurred,
   wherein the plurality of comparators includes a first comparator, a second comparator, and a third comparator, the selected number of the plurality of comparators includes two or more of the plurality of comparators, and fewer than the selected number of the plurality of comparators includes one or none of the plurality of comparators,
   wherein the logic circuit further includes a first AND gate, a second AND gate, a third AND gate, and an OR gate coupled to: an output of the first AND gate, an output of the second AND gate, and an output of the third AND gate,
   wherein an output of the first comparator is coupled to a first input of the first AND gate and to a first input of the second AND gate, an output of the second comparator is coupled to a second input of the first AND gate and to a first input of the third AND gate, and an output of the third comparator is coupled to a second input of the second AND gate and a second input of the third AND gate.

2. The apparatus of claim 1, wherein the logic circuit further includes a first AND gate and a second AND gate.

3. The apparatus of claim 2, wherein an output of the first comparator is coupled to a first input of the first AND gate, an output of the second comparator is coupled to a second input of the first AND gate, an output of the first AND gate is coupled to a first input of the second AND gate, and an output of the third comparator is coupled to a second input of the second AND gate.

4. The apparatus of claim 1, wherein at least one of the plurality of comparators is physically arranged in a non-linear manner with respect to at least two other ones of the plurality of comparators.

5. The apparatus of claim 1, wherein the logic circuit includes a programmable circuit.

6. The apparatus of claim 5, wherein the programmable circuit is configured to assign a first weight to a first overcurrent event determination made by a first of the plurality of comparators and a second weight to a second overcurrent event determination made by a second of the plurality of comparators, wherein the first weight is different from the second weight.

7. The apparatus of claim 5, wherein the programmable circuit is selectable to operate in a majority voting mode or a unanimous voting mode with respect to overcurrent event determinations made by the plurality of comparators.

8. An integrated circuit comprising:
a plurality of overcurrent detectors, each of the plurality of overcurrent detectors configured to detect a candidate overcurrent event; and
a voting circuit coupled to the plurality of overcurrent detectors, the voting circuit configured to indicate an overcurrent in response to receiving a selected number of candidate overcurrent events from the plurality of overcurrent detectors,
wherein the plurality of overcurrent detectors includes a first comparator, a second comparator, and a third comparator, and wherein the voting circuit further includes a first AND gate, a second AND gate, a third AND gate, and an OR gate coupled to an output of the first AND gate, an output of the second AND gate, and an output of the third AND gate,
wherein an output of the first comparator is coupled to a first input of the first AND gate and to a first input of the second AND gate, an output of the second comparator is coupled to a second input of the first AND gate and to a first input of the third AND gate, and an output of the third comparator is coupled to a second input of the second AND gate and a second input of the third AND gate.

9. The integrated circuit of claim 8, wherein at least one of the plurality of overcurrent detectors is disposed within the integrated circuit in a non-linear manner with respect to two or more of the plurality of overcurrent detectors.

10. The integrated circuit of claim 9, wherein the at least one of the plurality of overcurrent detectors is subject to detecting the candidate overcurrent in error due, at least in part, to ionizing radiation exposure.

11. The integrated circuit of claim 8, wherein the plurality of overcurrent detectors includes a first comparator, a second comparator, and a third comparator, and wherein the voting circuit includes a first AND gate and a second AND gate.

12. The integrated circuit of claim 11, wherein an output of the first comparator is coupled to a first input of the first AND gate, an output of the second comparator is coupled to a second input of the first AND gate, an output of the first AND gate is coupled to a first input of the second AND gate, and an output of the third comparator is coupled to a second input of the second AND gate.

* * * * *